Figure 1:
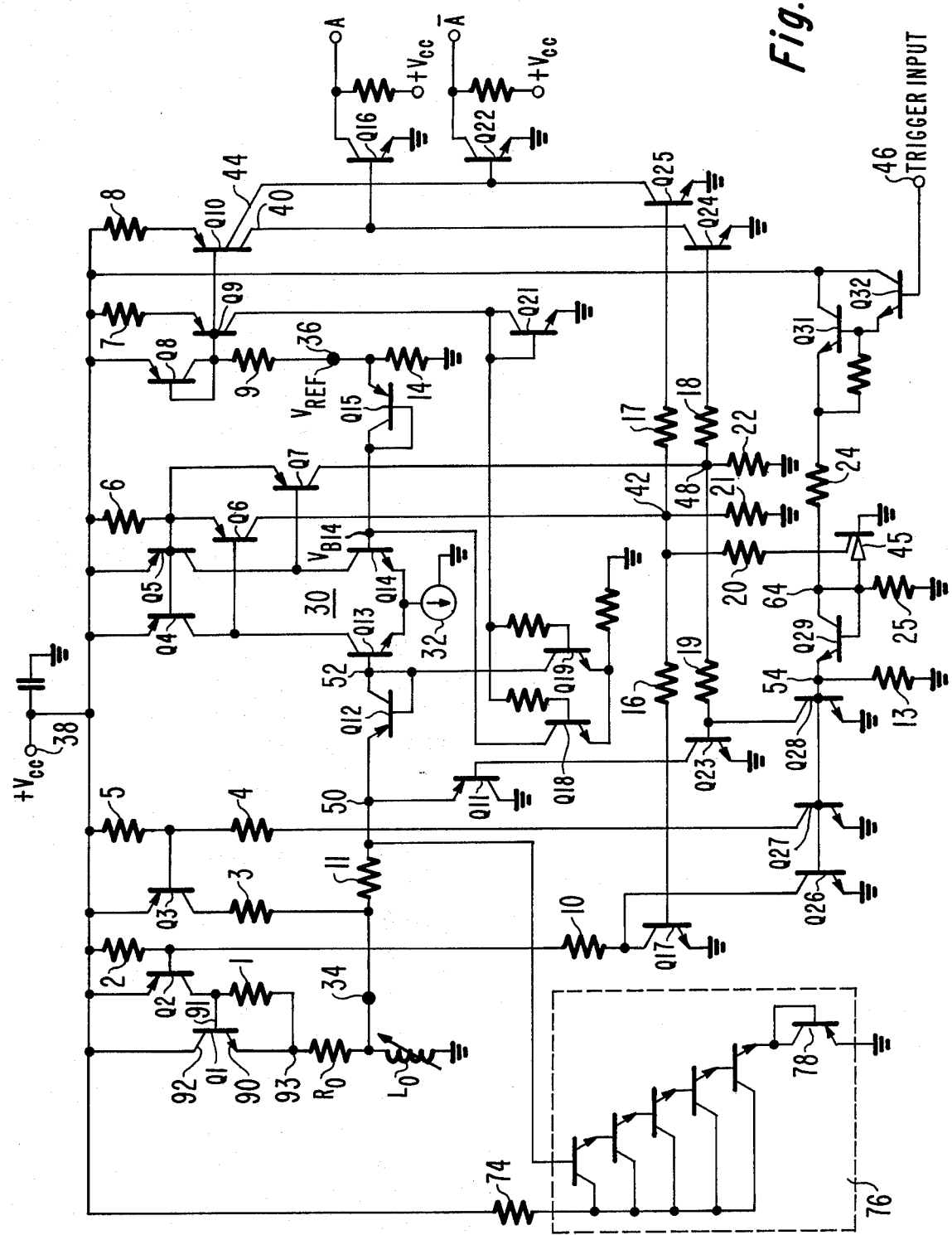

United States Patent [19]

Leidich

[11] 4,105,901
[45] Aug. 8, 1978

[54] MONOSTABLE CIRCUIT

[75] Inventor: Arthur John Leidich, Flemington, N.J.

[73] Assignee: RCA Corporation, New York, N.Y.

[21] Appl. No.: 795,140

[22] Filed: May 9, 1977

[30] Foreign Application Priority Data

May 21, 1976 [GB] United Kingdom ............... 21208/76

[51] Int. Cl.² .......................................... H03K 3/284
[52] U.S. Cl. .................................. 307/273; 307/237; 307/282; 328/146
[58] Field of Search ............... 328/146, 147, 113, 223, 328/261, 265; 307/273, 237, 282, 314

[56] References Cited

U.S. PATENT DOCUMENTS

| | | | |
|---|---|---|---|
| 2,668,236 | 2/1954 | McCoy | 328/113 X |
| 3,310,688 | 3/1967 | Ditkofsky | 328/146 X |
| 3,359,430 | 12/1967 | Jones | 307/273 X |
| 3,590,282 | 6/1971 | Ehat | 307/273 |
| 3,801,830 | 4/1974 | Boyer | 328/146 X |

*Primary Examiner*—John S. Heyman
*Attorney, Agent, or Firm*—H. Christoffersen; Samuel Cohen

[57] ABSTRACT

An inductance and resistance in the present monostable circuit control the duration of the quasi-stable state of the circuit. A keyed clamp damps the ringing which tends to be produced by the resonant circuit comprising the inductance and the stray capacitances coupled thereto, after the circuit switches from its quasi-stable state back to its stable state and thereby prevents false re-triggering of the circuit.

10 Claims, 2 Drawing Figures

MONOSTABLE CIRCUIT

The present invention relates to a monostable circuit of the type employing an inductance and a resistance as the means for controlling the duration of the quasi-stable state of the circuit.

Figure 2:
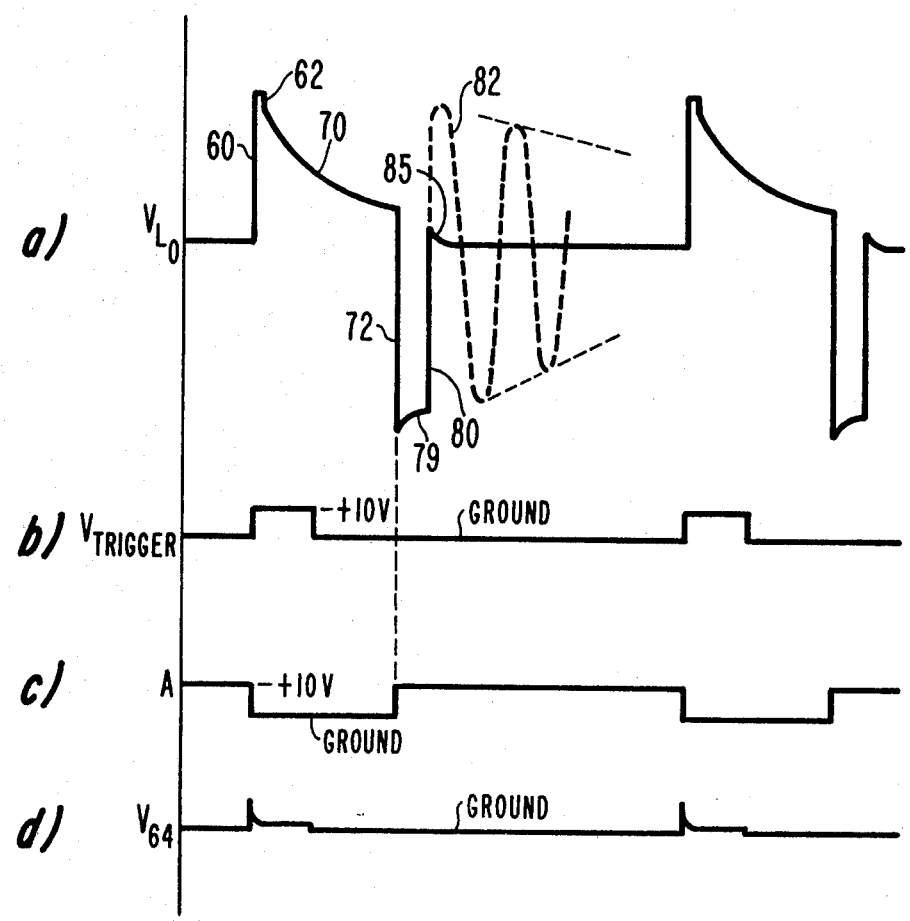

In the drawing:

FIG. 1 is a schematic circuit diagram of a monostable circuit embodying the invention; and FIG. 2 is a drawing of waveforms to help explain the operation of the circuit of FIG. 1.

The circuit of FIG. 1 includes an inductor $L_0$ and a resistor $R_0$. These are discrete elements; almost all of the remaining circuit elements shown are preferably integrated onto a common semiconductor substrate. The LR time constant of the two elements $L_0$ and $R_0$ is primarily what controls the duration of the quasi-stable state of the circuit. Either $L_0$ or $R_0$, or both may be variable, but in one particular design, $L_0$ was made variable for adjusting the duration of this quasi-stable state. The circuit also includes a comparator 30 comprising a differential amplifier. The latter includes two transistors Q13, Q14, the joined emitters of which connect to a current source 32. The base of transistor Q13 senses the voltage across the inductor $L_0$, that is, the voltage at terminal 34 and the base of transistor Q14 is coupled to a circuit point 36 which is held at a reference level $V_{REF}$.

Quiescently the voltage $V_{B14}$ at the base of transistor Q14 exceeds the voltage at the base of transistor Q13 so that transistor Q14 conducts and transistor Q13 is off. This is the stable state of the circuit. In response to a trigger pulse applied to terminal 46, the base of transistor Q13 driven to a voltage level greater than that at the base of transistor Q14 (as explained in more detail later) and the circuit switches to its quasi-stable state. After a certain time, dependent primarily on the values of $R_0$ and $L_0$, the base voltage of transistor 13 becomes lower than that of transistor Q14 and the circuit switches back to its stable state.

In the quiescent condition of the circuit, diode-connected transistor Q8 conducts and current flows from the input voltage supply terminal 38 through the path comprising transistor Q8 and resistors 9 and 14. With the supply voltage $V_{CC}$ at a level such as +10 volts, the reference voltage developed at node 36 is approximately 2.8 volts. Current therefore flows through diode-connected transistor Q15 and the base-emitter junction of transistor Q14, turning on transistor Q14. At the same time, as will be discussed shortly, there is no current flowing through inductor $L_0$ so that node 34 is at ground potential. The base of transistor Q13 also is substantially at ground level (as discussed shortly) so that transistor Q13 is off and transistor Q14 conducts all of the current withdrawn by current source 32.

As transistor Q14 is on, current flows through its collector-emitter path and transistor Q5. Transistor Q4 is in condition to conduct; however, as transistor Q13 is off, no current flows through transistor Q4.

The base-collector voltage of transistor Q5 forward biases the emitter-base junction of transistor Q7, turning this transistor on so that current flows through the path comprising resistor 6, the emitter-collector path of transistor Q7 and resistor 22. The current flow through resistor 6 places the emitter of transistor Q6 at a less positive potential than its base so that transistor Q6 is off. The voltage developed across resistor 22 in response to the flow of current therethrough from transistor Q7, acts as a forward bias for transistor Q24, turning this transistor on. The collector current demand of transistor Q24 is met by transistor Q10, current flowing through resistor 8 and the emitter-to-collector 40 path of transistor Q10. Transistor Q24 utilizes the entire collector current available at 40, whereby none remains for transistor Q16 and this transistor is therefore off. Accordingly, the output A of the monostable circuit is high at $+V_{CC}$.

It was previously mentioned that transistor Q6 is off. As no current flows through this transistor and resistor 21, node 42 of the circuit is at ground so that transistor Q25 is off. Accordingly, the current flowing from the collector 44 of transistor Q10 flows through the base-emitter junction of transistor Q22, turning this transistor on. The complementary output Ā of the circuit therefore is at ground level.

As node 42 of the circuit is at ground, the gate electrode of silicon controlled rectifier (SCR) 45 is also at ground. This tends to maintain the SCR off. It will be shown shortly that the anode of the SCR 45 also is at ground so that the SCR is off.

As node 42 is at ground, transistor Q17 is off and no current flows through resistor 2. Therefore, transistor Q2 is off as is transistor Q1. This confirms what was previously stated, namely that no current flows through resistor $R_0$ or inductor $L_0$ so that node 34 is at ground.

Transistors Q18 and Q19 operate as 10 microampere ($\mu$A) current sources in this particular circuit. Transistor Q18 conducts the current passing through transistor 15 when transistor Q14 is off; transistor Q19 acts as a bypass for current passing through transistor Q12 when transistor Q13 is off. Transistor Q12 which is connected as a diode, is designed to have a high reverse breakdown voltage, of the order of 80 volts in one particular design. Its purpose is to protect the emitter-base junction of transistor Q13, which may have a 7 volt reverse breakdown voltage, from the large negative voltage developed across inductor $L_0$ during one period in the operating cycle of the circuit, as will be brought out later.

Transistors Q31 and Q32 comprise a Darlington pair. In the quiescent state of the circuit, the trigger input terminal 46 is at ground level so that the Darlington pair is off. No current flows through resistor 24 or transistor Q29 so that, as previously stated, the anode of the SCR 45 is held at ground level and the SCR is off. Also, the three transistors Q26, Q27 and Q28 are off.

It was previously mentioned that quiescently, transistor Q7 is on so that current flows through resistor 22, placing node 48 at a positive voltage level. Current flows from node 48 through resistor 19 and through the base-emitter junction of transistor Q23, turning on transistor Q23. The effect is to clamp the base of transistor Q13 to close to ground level (actually to the collector-emitter saturation voltage level $V_{SAT}$ of transistor Q23). Note that transistor Q11 places node 50 at a level one base-emitter voltage drop ($1V_{BE}$) greater than this and transistor Q12 places node 52 at $1V_{BE}$ less than the voltage at node 50, confirming that node 52 is clamped to $V_{SAT}$ of transistor Q23, that is, at substantially ground level.

Assume now that a positive trigger pulse is applied to terminal 46. In practice, while the threshold of the circuit driven by the trigger pulse is about 2½ volts, the trigger pulse amplitude may be of the order of 10 volts, that is, the $V_{CC}$ level. The duration of this trigger pulse is not critical. It will be shown later that the circuit including the SCR differentiates the leading edge of this pulse, this leading edge switching the circuit to its quasi-stable state, and that, thereafter, the other elements of the circuit take over control and return the circuit to its stable state after a time primarily dependent on the LR time constant of $L_0$ and $R_0$.

When the trigger pulse goes positive, the Darlington pair Q31, Q32 goes on and current flows through the path from the $V_{CC}$ terminal 38 through the Darlington pair, resistor 24, transistor Q29 and resistor 13 to ground. The positive voltage thereby developed at node 54 at the bases of transistor Q26, Q27 and Q28 turns these three transistors on. A positive voltage also appears at the anode of the SCR 64; however, the gate of this SCR still is at ground (node 42 at ground) so that the SCR remains off.

When transistor Q28 goes on, it places the base of transistor Q23 substantially at ground, turning off transistor Q23. This removes the clamp on node 50 so that the base electrode of transistor Q13 is free to assume a different potential.

When transistor Q26 goes on, current flows through the path including resistors 2 and 10 and the collector-emitter path of transistor Q26. The voltage now present across resistor 2 is sufficient to turn on transistor Q2; transistor Q1 also turns on because of the flow of current through its base-emitter junction. This current tends to flow through resistor $R_0$ and inductor $L_0$; however, since the current through an inductor cannot change instantaneously, the voltage across the inductor, that is the voltage at node 34, very steeply rises to a high level as indicated at 60 in waveform $a$ of FIG. 2.

At the same time that the above is occurring, current flows through resistor 5 and resistor 4 into the collector of transistor Q27. The voltage developed across resistor 5 turns on transistor Q3 and its collector current flows through resistor 3 and attempts also to flow into the inductor $L_0$. This creates the small voltage spike 62 on waveform $a$ of FIG. 2. The amplitude of leading edge 60 of waveform $a$ is close to $V_{CC}$, where as already mentioned, $V_{CC}$ may be 10 volts or so.

When node 34 steeply rises in potential, the base electrode of transistor Q13 also quickly assumes a potential greater than the voltage present at the base of transistor Q14 (the voltage $V_{B14}$ at the base of transistor Q14 is $1V_{BE}$ lower than $V_{REF}$). As soon as the base electrode of transistor Q13 becomes more positive than that of transistor Q14, transistor Q13 starts conducting and transistor Q14 goes off. Transistor Q4 now conducts the current supplied to the collector of transistor Q13; transistor Q5 is is saturation but does not conduct collector current; and transistor Q7 goes off because its base electrode goes relatively positive with respect to its emitter electrode. When transistor Q7 goes off, node 48 goes to ground level and this turns off transistor Q24. The collector 40 current of transistor Q10 now flows through the base-emitter junction of transistor Q16 and this turns this transistor on. The output A therefore switches from the $+V_{CC}$ level to ground level.

When node 48 goes to ground, transistor Q23 no longer receives base-emitter current and this holds transistor Q23 off. It will be recalled that the base of transistor Q23 already had been placed substantially at ground level by conducting transistor Q28.

When transistor Q4 conducts, its base-collector voltage turns on transistor Q6 so that node 42 assumes a positive voltage level. This turns on transistor Q25 so that substantially all of the current supplied by the collector electrode 44 of transistor Q10 flows into the collector of transistor Q25. This causes transistor Q22 to turn off and A switches from ground level to $+V_{CC}$.

The positive level at 42 also turns on transistor Q17. This transistor is in parallel with transistor Q26 so that when transistor Q26 later goes off, transistor Q17 will still maintain transistors Q1 and Q2 conducting.

The positive level at node 42 causes gate current to flow in the SCR 45. The anode of this SCR already is positive so that the SCR turns on. When the SCR turns on, it places node 64 at a level close to ground so that transistors 26, 27 and 28 turn off. In this respect, the SCR device 45 in cooperation with the remaining circuit elements, operates as a differentiator for the leading (positive-going) edge of the trigger pulse. In response to the leading edge of the input trigger pulse, node 64 goes positive and shortly thereafter, the voltage at node 64 decays to close to ground level (actually to $V_{BE}+V_{SAT}$ which is the anode-to-cathode drop across the conducting SCR). The voltage present at node 64—the anode of the SCR, is shown at $d$ in FIG. 2. Note that when the trigger pulse terminates, the SCR stops conducting and the anode voltage returns to ground level.

When transistor Q27 goes off, immediately after the leading edge of the trigger pulse, current stops flowing through resistors 5 and 4 and transistor Q3 goes off. This stops the flow of current through the emitter-to-collector path of transistor Q3 to the inductor $L_0$ and this terminates the short spike 62 at the apex of the positive voltage swing across the inductor. As previously mentioned, the turn off of transistor Q26 does not affect transistors Q1 and Q2 which remain on because transistor Q17 is still on.

When transistor Q28 goes off, transistor Q23 would be able to turn on if there were base drive voltage present at node 48. However, as already mentioned, node 48 is at ground level so that transistor Q23 remains off.

After the initial positive voltage peak develops across the inductor $L_0$, it starts to conduct current and the voltage across the inductor decays exponentially, as indicated at 70 in waveform $a$ of FIG. 2. The rate of decay is a function of the LR time constant of the inductor charging circuit. When the voltage decays sufficiently that the base electrode of transistor Q13 reaches a voltage level lower than that on the base electrode of transistor Q14, the comparator 30 switches states, that is, transistor Q13 stops conducting and transistor Q14 conducts all of the current withdrawn by source 32.

In response to the above, node 42 goes to ground level causing transistor Q17 to turn off and this causes transistors Q1 and Q2 to go off. This terminates the flow of current to the inductor $L_0$ and in response thereto, the voltage across the inductor changes polarity, node 34 going highly negative as indicated at 72 of waveform $a$ in FIG. 2. Node 34 continues to go negative until the stack 76 of zener diodes is driven into conduction. This stack comprises a group of NPN transistors, the collectors of which are connected through a resistor 74 to the $V_{CC}$ terminal 38. The emitter of each transistor is connected to the base of the following transistor and the emitter of the last transistor is connected to the base-collector connection of a PNP transistor 78. The emitter of this PNP transistor is connected to ground. When the voltage at node 50 reaches the combined reverse breakdown level of the series connected base emitter junctions of the stack 76 plus the base-emitter forward voltage of the PNP diode connected transistor 78, conduction occurs through the stack 76 and the node 50 is clamped to this breakdown level. The breakdown level may be of the order of −36 volts or so. It is to be understood, of course, that other voltage reference means may be used instead of the stack of zener diodes. For example, one could employ a string of diodes which are series connected in the forward direction and depend upon the multiple $V_{BE}$ voltage developed across the string for the desired voltage reference level.

The large negative voltage swing above is prevented from damaging transistor Q13 by the diode connected transistor Q12. This transistor Q12 has a large reverse breakdown voltage so that the major part of this negative voltage develops across Q12 and insuffficient voltage remains to break down the base-emitter junction of transistor Q13.

PNP transistor Q11, which is of opposite conductivity type than transistor Q23, acts as a blocking diode when nodes 34 and 50 go negative during the discharge of inductor $L_0$. If transistor Q11 were not present, the negative excursion would forward bias the collector-base junction of transistor Q23 (and also its collector substrate junction in an integrated circuit) and be clamped thereby to a small negative value. Transistor Q11 may be replaced by a diode (connected at its anode to node 50 and at its cathode to the collector of transistor Q23) of sufficiently high reverse breakdown voltage and similar operation obtained, assuming the loss of Q11's transistor gain is not critical (which it is not in the particular integrated circuit illustrated).

After the large negative swing, as shown at 72 in FIG. 2, current flow through the inductor $L_0$ decreases and the voltage thereacross becomes less negative, as indicated at 79 in waveform a of FIG. 2. When the current reduces to zero and it attempts to reverse, the voltage across the inductor swings in a positive direction as shown at 80 in FIG. 2. Were there no means present to prevent it, the voltage across the inductor would tend to swing highly positive-close to $V_{CC}$ (close to 10 volts in this example). The circuit comprising the inductor $L_0$ and the distributed capacitance coupled thereto, acts like a tuned circuit and were it not prevented, this circuit would ring at its resonant frequency as indicated by the sinusoid shown in phantom at 82 in FIG. 2. This, of course, would be disastrous to the circuit operation because the positive swing of the sinusoid, to a value such that the voltage on the base of electrode Q13 exceeded that at the base of transistor Q14, would cause the monostable circuit to retrigger.

In the present circuit, the above does not occur. It does not because of the clamping action of transistors Q11 and Q23. At the time the voltage across the inductor attempts to swing positive, transistor Q13 is off so transistor Q6 is off and node 42 is at ground, and transistor Q14 is conducting so that transistor Q7 is on and node 48 is positive. Thus, transistor Q23 is on. This places the base of PNP transistor Q11 at close to ground level, conditioning Q11 to turn on when its emitter is driven positive. When node 50 attempts to go positive, transistor Q11 is driven into heavy conduction, clamping node 50 to ground. This is indirectly illustrated at 85 in waveform A of FIG. 2. Node 34 first goes slightly positive and then is clamped at ground level. This small positive level corresponds to a lower voltage level at the base of transistor Q13 than is present at the base of transistor Q14 so that transistor Q13 remains off and the circuit 30 remains in its stable state, that is, A remains high (at $+V_{CC}$) and A remains at ground. The circuit remains in this condition until the next trigger pulse arrives whereupon the cycle described is repeated.

In the claims which follow, the terms "greater than" and "less than" are intended to be generic to both relatively positive and relatively negative changes in voltage level. In other words, while the invention is illustrated in terms of a comparator 30 employing NPN transistors, it is equally applicable to a circuit employing PNP transistors for the comparator, with appropriate changes in the power supply voltages and associated circuits.

What is claimed is:

1. In combination:
    a comparator having first and second input terminals, said first terminal receptive of a voltage at a reference level and said second terminal for receiving a signal voltage which is to be compared with the reference voltage, said comparator having an output terminal and producing at said output terminal a voltage at one level when the voltage at said first terminal is greater than that at said second terminal and a voltage at a second level when the voltage at said first terminal is less than that at said second terminal;
    means for applying to said second terminal a signal voltage which initially is at a level lower than said reference level, which then increases in amplitude to a level higher than said reference level, which then again reduces in amplitude to a level lower than said reference level, and which later abruptly increases in amplitude to a level which tends to exceed said reference level; and
    means for conditioning said circuit, when said signal voltage reduces in amplitude to a level lower than said reference level, to respond to said tendency of said signal voltage later abruptly to increase in amplitude to a level which exceeds said reference level, for clamping said second terminal to a voltage lower than said reference level.

2. In the combination as set forth in claim 1, said means for applying to said second terminal said signal voltage comprising:
    an inductor-resistance circuit;
    means responsive to a trigger signal for supplying a current to said inductor through said resistance and for terminating said flow of current through said resistance when the voltage at said second terminal reduces to a value lower than said reference level; and
    said inductor-resistance circuit including distributed capacitance which forms with said inductor a tuned circuit which tends to ring in response to the abrupt change in polarity of the voltage across said inductor which occurs when the current therethrough attempts to reverse direction after the flow of current through said resistance ceases.

3. In the combination as set forth in claim 1, said means for conditioning said circuit comprising:
    first and second transistors of opposite conductivity types, each having emitter, base and collector electrodes, the emitter-to-collector path of said first transistor being coupled between said second input terminal and a point of reference potential, and the base of said first transistor being coupled through the collector-to-emitter path of said second transistor, to said point of reference potential;
    means for cutting off said second transistor during the time said signal voltage is of greater amplitude than said reference level, whereby no base current flows through said first transistor and the latter remains off; and means responsive to said reduction in the amplitude of said signal voltage to a level lower than said reference level for conditioning said second transistor to conduct, whereby when the voltage on said second terminal attempts again to increase to greater than said reference level, said first transistor conducts and clamps said second terminal to a voltage level lower than said reference level.

4. In the combination as set forth in claim 3, said first transistor being coupled to said second terminal via a diode connected transistor.

5. A keyed clamp comprising, in combination;
a circuit node;
first, second and third transistors, each having base, emitter and collector electrodes, the first being of one conductivity type and the second and third being of opposite conductivity type, said first transistor being connected at its emitter electrode to said circuit node, at its collector electrode to a point of reference potential, and at its base electrode to the collector electrode of said second transistor, said second transistor being connected at its emitter electrode to said point of reference potential and at its base electrode to the collector electrode of said third transistor, and the emitter electrode of said third transistor being connected to said point of reference potential;

means operative during a first time interval for applying a turn-off voltage level to the base electrode of said third transistor and a turn-on voltage level to the base electrode of said second transistor, whereby said first transistor clamps said circuit node to said point of reference potential;

means operative during a second time interval following the first for applying a turn-on voltage to said base electrode of said third transistor thereby clamping said base electrode of said second transistor to said point of reference potential, whereby said first and second transistors turn off;

means operative during a third time interval following the second, for removing said turn-on voltage from the base electrode of said third transistor and applying a turn-off voltage to the base electrode of said second transistor, whereby the first and second transistors remain off; and means operative during a fourth time interval following the third for applying a turn-on voltage to said base electrode of said second transistor, whereby said first transistor again clamps said circuit node to said point of reference potential.

6. In a monostable circuit which includes an inductance and resistance for together controlling the duration of the quasi-stable state of the circuit, amplifier means having an input terminal to which a voltage proportional to that across said inductance is applied and which switches from an initial to a second state when the voltage applied thereto is greater than a given level and which returns to its initial state when the voltage applied to said input terminal is equal to or lower than said given value, means responsive to a trigger pulse for supplying a current to said inductance through said resistance to thereby cause an abrupt increase in the voltage thereacross to a level such that the voltage supplied to said input terminal exceeds said given value, whereby said amplifier means switches to its second state and which voltage subsequently decays with time as the current flow through said inductance increases, whereby when said voltage reaches a level equal to said given value, said amplifier means returns to its initial state, and means responsive to the switching of said amplifier means to its initial stage for cutting off the current flow through said resistance to said inductance, whereby, when the current flow through said inductance stops, the voltage thereacross abruptly increases and tends again to cause said amplifier means to change to its second state, the improvement comprising:

means responsive to said tendency of the voltage at said input terminal to increase to a value greater than said given level in the absence of a new trigger pulse, for clamping said input terminal to a voltage lower than said given value thereby preventing said change to said second state.

7. In a monostable circuit as set forth in claim 6, said means for clamping comprising:

a switch connected between said input terminal and a circuit point at a voltage level lower than said given value; and means responsive to the return of the amplifier means to its initial state for closing said switch.

8. In a monostable circuit as set forth in claim 7, said switch comprising a transistor having a conduction path connected between said input terminal and ground and a control electrode, and said means responsive to the return of the amplifier means to its initial state comprising means for applying an enabling signal to said control electrode.

9. In a monostable circuit as set forth in claim 7, said switch comprising a first transistor having base, emitter and collector electrodes, connected at its emitter electrode to said input terminal and at its collector electrode to said circuit point, and said means responsive to the return of the amplifier means to its initial state comprising a second transistor of opposite conductivity type than the first transistor, having also base, emitter and collector electrodes, said second transistor connected at its collector electrode to the base electrode of said first transistor and at its emitter electrode to said circuit point, and means for applying a forward current to the base electrode of said second transistor when said amplifier means returns to its initial state.

10. In a monostable circuit as set forth in claim 9, further including:

a third transistor having base, emitter and collector electrodes, of the same conductivity type as said second transistor, connected at its collector electrode to the base electrode of said second transistor and at its emitter electrode to said circuit point;

means responsive to said trigger pulse for momentarily applying a forward current to said base electrode of said third transistor, thereby disabling said second transistor; and means responsive to the amplifier when it is in its second state for applying a voltage to the base electrode of said second transistor at a level to maintain the same disabled.

* * * * *

UNITED STATES PATENT AND TRADEMARK OFFICE
CERTIFICATE OF CORRECTION

PATENT NO. : 4,105,901

DATED : August 8, 1978

INVENTOR(S) : Arthur John Leidich

It is certified that error appears in the above-identified patent and that said Letters Patent is hereby corrected as shown below:

Column 2, line 16, "A" should be --$\bar{A}$--.

Column 3, line 51, "is" (second occurrence) should be --in--.

Column 4, line 3, "A" should be --$\bar{A}$--.

Signed and Sealed this

Sixth Day of February 1979

[SEAL]

Attest:

RUTH C. MASON
Attesting Officer

DONALD W. BANNER
Commissioner of Patents and Trademarks